United States Patent
Lin

(10) Patent No.: US 12,092,667 B2
(45) Date of Patent: Sep. 17, 2024

(54) USB SLAVE DEVICE AND POWER QUALITY TESTING METHOD THEREOF

(71) Applicant: Nanning FuLian FuGui Precision Industrial Co., Ltd., Nanning (CN)

(72) Inventor: Yung-Chieh Lin, New Taipei (TW)

(73) Assignee: Nanning FuLian FuGui Precision Industrial Co., Ltd., Nanning (CN)

( * ) Notice: Subject to any disclaimer, the term of this patent is extended or adjusted under 35 U.S.C. 154(b) by 46 days.

(21) Appl. No.: 18/112,124

(22) Filed: Feb. 21, 2023

(65) Prior Publication Data

US 2024/0280616 A1  Aug. 22, 2024

(51) Int. Cl.
- *G01R 21/00* (2006.01)
- *G06F 1/26* (2006.01)
- *G08B 5/36* (2006.01)

(52) U.S. Cl.
CPC ............. *G01R 21/00* (2013.01); *G06F 1/266* (2013.01); *G08B 5/36* (2013.01)

(58) Field of Classification Search
CPC . G01R 21/00; G06F 1/26; G06F 1/266; G06F 1/3287
See application file for complete search history.

(56) References Cited

U.S. PATENT DOCUMENTS

| | | | | |
|---|---|---|---|---|
| 7,506,219 B2* | 3/2009 | Bhesania | ............. | G06F 11/3055 714/57 |
| 8,443,130 B2* | 5/2013 | Xie | ......................... | G06F 1/266 714/25 |
| 9,515,502 B2* | 12/2016 | Kim | ........................ | H02J 7/0068 |
| 2012/0159228 A1* | 6/2012 | Arimoto | ............. | G03G 15/5004 713/340 |
| 2014/0111030 A1* | 4/2014 | Chou | ....................... | G06F 1/305 307/130 |
| 2017/0067968 A1* | 3/2017 | Lee | ........................ | G01R 31/40 |
| 2019/0294223 A1* | 9/2019 | Singh | .................... | G06F 1/3212 |

FOREIGN PATENT DOCUMENTS

| | | |
|---|---|---|
| CN | 103777730 B | 5/2016 |
| CN | 106160510 A | 11/2016 |
| CN | 208283484 U | 12/2018 |
| TW | 201222244 A | 6/2012 |
| TW | 201625966 A | 7/2016 |
| WO | WO-2015173141 A1 * 11/2015 ............... G06F 1/26 |

* cited by examiner

*Primary Examiner* — Jaweed A Abbaszadeh
*Assistant Examiner* — Cheri L Harrington
(74) *Attorney, Agent, or Firm* — ScienBiziP, P.C.

(57) ABSTRACT

A USB slave device and its power quality testing method, where the USB slave device is preset to enable only minimum functions required for the power quality testing method. When the USB slave device is connected to the USB power supply device, the power quality testing is activated. If the USB slave device is not rebooted after a period of time, the power quality testing is determined to be passed and fully functionality of the USB salve device is activated.

10 Claims, 2 Drawing Sheets

USB SLAVE DEVICE AND POWER QUALITY TESTING METHOD THEREOF

FIELD

The subject matter herein generally relates to power technologies.

BACKGROUND

When a USB slave device is powered by a USB power supply device that is lower than the product specification of the USB slave device or does not comply with the USB specification, the USB slave device will experience unexpectedly power loss, reboot, or inability to perform specific functions of the USB slave device, causing the user to misunderstand that the USB slave device is damaged.

In order to increase user experience and reduce unnecessary return costs, it is necessary to add a power quality testing mechanism to USB slave devices.

BRIEF DESCRIPTION OF THE DRAWINGS

Implementations of the present technology will now be described, by way of embodiment, with reference to the attached figures, wherein.

DETAILED DESCRIPTION

Figure 1:
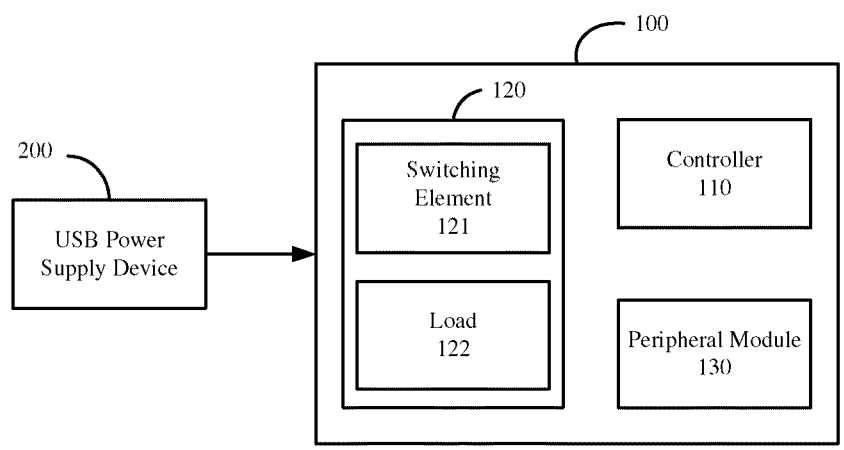
FIG. 1 is a block diagram of one embodiment of a USB slave device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

References to "an" or "one" embodiment in this disclosure are not necessarily to the same embodiment, and such references mean "at least one".

In general, the word "module" as used hereinafter, refers to logic embodied in computing or firmware, or to a collection of software instructions, written in a programming language, such as, Java, C, or assembly. One or more software instructions in the modules may be embedded in firmware, such as in an erasable programmable read only memory (EPROM). The modules described herein may be implemented as either software and/or computing modules and may be stored in any type of non-transitory computer-readable medium or other storage device. Some non-limiting examples of non-transitory computer-readable media include CDs, DVDs, BLU-RAY, flash memory, and hard disk drives. The term "comprising", when utilized, means "including, but not necessarily limited to"; it specifically indicates open-ended inclusion or membership in a so-described combination, group, series, and the like.

FIG. 1 illustrates a USB slave device 100 according to an embodiment. The USB slave device 100 is a device that must be powered by a USB power supply device 200. The USB power supply device is a device that comprises a USB port that can actively supply power to the USB slave device 100. The USB slave device 100 and the USB power supply device 200 are connected through the USB port. The USB power supply device 200 may be a computer, a tablet, a television, and a USB charger.

The USB slave device 100 comprises a controller 110, a power quality testing circuit 120, and a peripheral module 130. The controller 110 comprises a microcontroller (MCU) for performing a power quality testing method and controlling the operation of the USB slave device 100. The power quality testing circuit 120 comprises a switching element 121 and a load 122 for detecting whether the USB power supply device 200 can provide the required rated current, where the switching element 121 comprises a MOS tube or a power switching integrated circuit and the load 122 comprises a complex resistor. The peripheral module 130 controls the enabling and the disabling of the functions, wherein the functions comprise software modules and hardware components, such as memory cards, Bluetooth, WiFi, and speakers.

In one embodiment, when the USB slave device 100 is in the prototype stage, the power consumption current value, i.e., the rated current, of the entire device is estimated according to the product specification and the software functions. After the USB slave device 100 enters the trail production, the required minimum power consumption current value is measured and confirmed according to the plural function of the software default enablement. Based on the power supply rating current, the switching components are selected to meet the requirements, and the appropriate load is selected based on the preset power supply rating current and the minimum power consumption current value.

In one embodiment, the peripheral module 130 is preconfigured to enable only the minimum functionality required to perform power quality testing, such as memory for reading and writing data, and communication interfaces for two-way communication with the USB power supply device 200. For example, when the USB slave device 100 is a smart TV box, the features enabled by default comprise features such that as a high-definition multimedia interface, a memory, and a Bluetooth.

Figure 2:
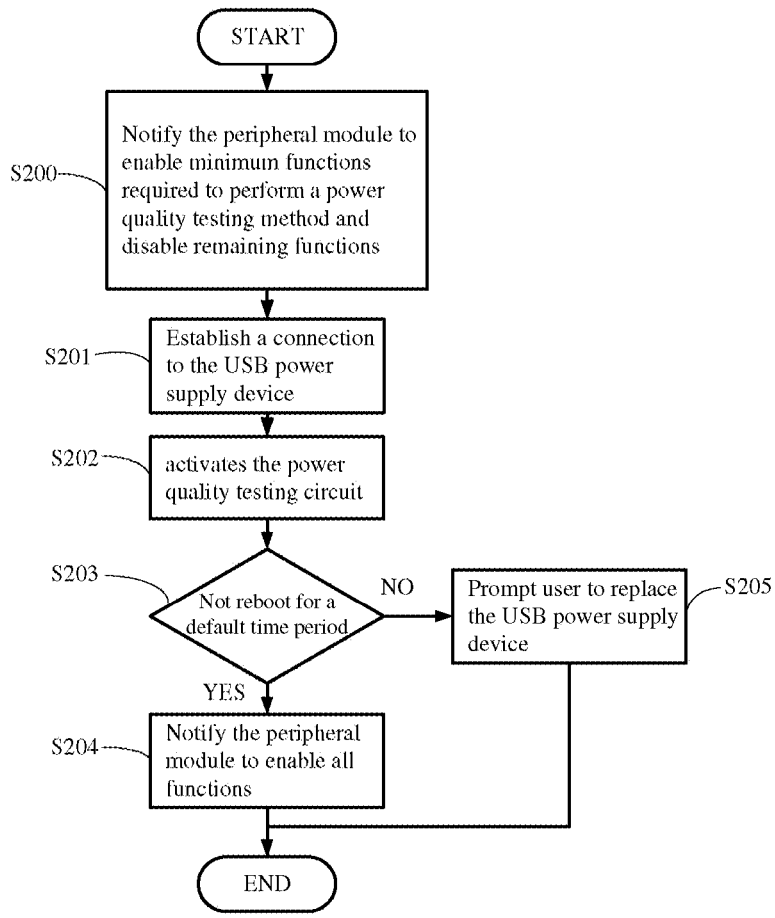
FIG. 2 is a flow chart of one embodiment of a method for testing the power quality of the USB slave device.

FIG. 2 illustrates a method for power quality testing for a USB slave device, according to an embodiment. The method is applied in the USB slave device and is executed by the controller of the USB slave device.

Step S200, the controller notifies the peripheral module to enable minimum functions required to perform a power quality testing module and disable remaining functions. Step S201, the controller establishes a connection to the USB power supply device.

In one example, after the USB slave device establishes the connection with the USB power supply device, the USB power supply device obtains a product identification code (PID) and a supplier identification code (VID), and determines whether the USB power supply device is a designated device based on the PID and the VID.

In one example, when USB slave device determines that the USB power supply device is a transformer attached to the USB slave device from the factory based on the PID and the VID, the USB slave device can perform the steps related to the power quality testing. When the USB slave device cannot obtain the PID and the VID of the USB power supply device, the power quality testing procedure is continued.

Step S202, the controller activates the power quality testing circuit.

In one embodiment, the controller sends an activation signal to the switching element of the power quality testing circuit to turn on the power path which passes the load of the power quality testing circuit.

In one embodiment, after the USB slave device is powered on, a power testing flag and a full functionality flag are generated and stored in the memory. The power testing flag is used to indicate whether a power quality testing method has been performed, with "0" representing that a power quality testing method has not been performed and "1" representing that a power quality testing method has been performed. The full functionality flag is used to indicate the result of the power quality testing, with "0" representing that the power quality testing has not been passed and "1" representing that the power quality testing has been passed.

In one embodiment, the flag value of both flags is defaulted to "0". Every time the USB slave device is rebooted, the flag values of the two flags are read to confirm the current status of the power quality testing.

When the controller sends the activation signal to the switching element of the power quality testing circuit, the flag value of the power testing flag is set to 1 and stored in the memory to indicate the status of the power quality testing.

In one embodiment, the load composition is based on the default power supply rating current and, for example, the USB slave device requires a current of at least 760 mA, i.e., the USB power supply device needs to meet the USB 3.0 protocol requirement of at least 900 mA. During the pilot production, it was calculated that a current of 600 mA is required to pass through the load, so the load is connected in parallel with two 16 ohm resistors to meet the requirements of the power quality testing. When the switching element of the power quality testing circuit is activated, additional current would be generated through the load. At this time, if the USB power supply device is a 500 mA power supply, the USB slave device would reboot directly because the current provided by the USB power supply device is exceeded.

Step S203, the controller determines whether the USB slave device remains stable for a default time period and does not reboot.

When it is determined that the USB slave device remains stable for the default time period and does not reboot, the step S204 is executed. In one example, the default time period is 5 seconds. On the contrary, when the USB slave device is rebooted, it means the power quality testing is not passed, then the USB slave device reads the flag value of the power testing flag as "1" and the flag value of the full functionality flag a "0", which means the power quality testing is not passed, then the step S205 is executed.

Step S204, the controller notifies the peripheral module to enable all the functions.

When the power quality testing is passed, it means that the connected USB power supply device could meet the operation requirements of the USB slave device, so the peripheral module is notified to enable all functions and the flag value of the full functionality flag is set to "1" and stored.

There may be a situation that the USB slave device is rebooted, the flag value of the power testing flag is read as "0" and the flag value of the full functionality flag is read as "1". Since it is not possible to set the flag value of the full functionality flag to 1 without passing the power quality testing, the situation would be determined by the controller that the operation is malfunctioning, the flag value of the full functionality flag is set to "0" and the power quality testing method is performed again.

In one embodiment, when the power quality testing result is passed, but the user reboots the USB slave device manually, the flag value of the power testing flag and the flag value of the full functionality flag are both read as 1 after powering on the USB slave device. In the embodiment, the flag values of the power testing flag and the full functionality flag are both read to "1", but it is still necessary to set the flag value of both flags to "0" and perform the power quality testing method.

Step S205, the controller prompts the user to replace the USB power supply device.

In one embodiment, when the power quality testing of the USB slave device fails, the USB slave device prompts to the user through one or more LEDs that the user needs to replace the USB power supply device and the USB slave device is currently limited in the functionality.

In one embodiment, the USB slave device sends an alert message to the USB power supply device when the power quality testing fails. For example, if the USB slave device is an OTT dongle and the USB power supply device is a TV, the USB slave device may send an alert message to the display of the USB power supply device to notify the user that a non-conforming power source has been detected and that the user is currently unable to use the full functionality of the USB slave device.

The method for power quality testing and the USB slave device of the disclosure detect whether the USB power supply device used by users meets the specification of the USB slave device, clarify the causes of unexpected reboot and malfunction, increase user experience and reduce unnecessary product rework.

The embodiments shown and described above are only examples. Many details are often found in the art such as the other features of the portable device 100. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A USB slave device comprising a controller, a power quality testing circuit and a peripheral module, wherein
the power quality testing circuit is configured for detecting current supplied by a USB power supply device;
the peripheral module is configured for controlling enabling and disabling of each function, wherein the peripheral module is pre-configured to enable minimum functions required to perform a power quality testing method and disable remaining functions; and
the controller is configured to perform the power quality testing method, which comprises the following steps:
establishing a connection to the USB power supply device;
activating the power quality testing circuit;
determining whether the USB slave device has not rebooted for a default time period;

notifying the peripheral module to enable all functions when the controller determines that the USB slave device has not rebooted for the default time period; and prompting a user to replace the USB power supply device when the USB slave device is determined to be rebooted.

2. The USB slave device of claim 1, wherein the power quality testing circuit comprises a switching element and a load, and the step of activating the quality testing circuit further comprises:

sending an activation signal to the switching element turn on a power path which enables the load.

3. The USB slave device of claim 1, wherein the step of prompting a user to replace the USB power supply device when the USB slave device is determined to be rebooted further comprises:

prompting the user by a LED indicator of the USB slave device.

4. The USB salve device of claim 1, wherein the step of prompting a user to replace the USB power supply device when the USB slave device is determined to be rebooted further comprises:

sending an alert message to the USB power supply device to display the alert message on a display of the USB power supply device.

5. The USB slave device of claim 2, wherein a composition of the load is set according to a default power supply rated current and a minimum power consumption current value of the USB slave device.

6. A power quality testing method applied in a USB slave device, wherein a peripheral module of the USB slave device is pre-configured to enable minimum functions required to the power quality testing method and to disable remaining functions, the method comprising the following steps:

establishing a connection to the USB power supply device;

activating a power quality testing circuit of the USB slave device;

determining whether the USB slave device has not rebooted for a default time period;

notifying the peripheral module to enable all functions when it is determines that the USB slave device has not rebooted for the default time period; and prompting a user to replace the USB power supply device when the USB slave device is determined to be rebooted.

7. The power quality testing method of claim 6, wherein the power quality testing circuit comprises a switching element and a load, and the step of activating a quality testing circuit further comprises:

sending an activation signal to the switching element turn on a power path which enables the load.

8. The power quality testing method of claim 6, wherein the step of prompting a user to replace the USB power supply device when the USB slave device is determined to be rebooted further comprises:

prompting the user by a LED indicator of the USB slave device.

9. The power quality testing method of claim 6, wherein the step of prompting a user to replace the USB power supply device when the USB slave device is determined to be rebooted further comprises:

sending an alert message to the USB power supply device to display the alert message on a display of the USB power supply device.

10. The power quality testing method of claim 7, wherein a composition of the load is set according to a default power supply rated current and a minimum power consumption current value of the USB slave device.

* * * * *